(12) United States Patent
Tamura (10) Patent No.: US 8,184,189 B2
(45) Date of Patent: May 22, 2012

(54) IMAGE SENSING DEVICE AND IMAGE SENSING SYSTEM

(75) Inventor: Seiichi Tamura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 375 days.

(21) Appl. No.: 12/623,747

(22) Filed: Nov. 23, 2009

(65) Prior Publication Data

US 2010/0134646 A1 Jun. 3, 2010

(30) Foreign Application Priority Data

Dec. 3, 2008 (JP) .................................. 2008-308999

(51) Int. Cl.
*H04N 3/14* (2006.01)
*H04N 5/335* (2011.01)

(52) U.S. Cl. ...... 348/308; 257/294; 257/435; 250/208.1

(58) Field of Classification Search .................. None
See application file for complete search history.

(56) References Cited

U.S. PATENT DOCUMENTS

| | | | | |
|---|---|---|---|---|
| 7,205,523 | B2 | 4/2007 | Mishima et al. | 250/208.1 |
| 7,205,623 | B2 | 4/2007 | Hong et al. | 257/435 |
| 7,365,380 | B2 | 4/2008 | Yuzurihara et al. | 257/292 |
| 7,592,579 | B2 | 9/2009 | Tamura et al. | 250/208.1 |
| 2002/0117690 | A1* | 8/2002 | Rhodes | 257/215 |
| 2006/0007338 | A1 | 1/2006 | Wakano et al. | 348/308 |
| 2006/0060899 | A1* | 3/2006 | Hong et al. | 257/294 |
| 2007/0045665 | A1* | 3/2007 | Park | 257/204 |
| 2008/0054388 | A1* | 3/2008 | Nakata et al. | 257/432 |
| 2009/0108389 | A1* | 4/2009 | Inoue | 257/435 |

FOREIGN PATENT DOCUMENTS

| | | |
|---|---|---|
| JP | 2006-032374 A | 2/2006 |
| JP | 2006-093687 A | 4/2006 |
| JP | 2008-042825 A | 2/2008 |

* cited by examiner

*Primary Examiner* — Lin Ye
*Assistant Examiner* — Dennis Hogue
(74) *Attorney, Agent, or Firm* — Fitzpatrick, Cella, Harper & Scinto (57) ABSTRACT

The image sensing device includes a semiconductor substrate; a light shielding layer that is arranged above the semiconductor substrate and shields an optical black region and a peripheral region from light; a first capacitance element that is arranged between the light shielding layer in the peripheral region and the semiconductor substrate and is used to temporarily hold signals output from effective pixels or optical black pixels; and a second capacitance element that is arranged between the light shielding layer in the optical black region and the semiconductor substrate so as to shield the photoelectric conversion units of the optical black pixels from light.

8 Claims, 9 Drawing Sheets

IMAGE SENSING DEVICE AND IMAGE SENSING SYSTEM

BACKGROUND OF THE INVENTION

1. Field of the Invention

The present invention relates to an image sensing device and an image sensing system.

2. Description of the Related Art

Image sensing devices have been recently used as two-dimensional image input devices mainly including digital still cameras and video camcorders or one-dimensional image reading devices mainly including facsimiles and scanners, and the demand for image sensing devices is rapidly increasing. CCD (Charge-Coupled Device) sensors and MOS sensors are used as such image sensing devices. As a typical example of such MOS sensors, CMOS sensors have been put to practical use.

Japanese Patent Laid-Open No. 2008-42825 discloses that, as shown in FIG. 2 of Japanese Patent Laid-Open No. 2008-42825, a pixel portion 10 of a solid-state image sensing device 1 has a photodiode 12 serving as a photoelectric conversion element, a memory group 14, and an amplifier 16. The memory group 14 includes N (N is an integer) memories serving as storage elements. Each memory holds and stores signal electric charges output from the photoelectric transducer as an analog quantity. The memory group 14 selectively reads out a signal from one or more memories of the N memories. The amplifier 16 amplifies the signal selectively read out from the memory group 14. Japanese Patent Laid-Open No. 2008-42825 describes that the memories of the memory group 14 may be MIM (Metal-Insulator-Metal) capacitances, as shown in FIG. 14 of Japanese Patent Laid-Open No. 2008-42825.

An image sensing device has an image sensing region and a peripheral region arranged on the periphery of the image sensing region. In some cases, this image sensing region is configured to include an effective region in which a plurality of effective pixels including photoelectric conversion units that are not shielded from light is arranged and an optical black region that is a region adjacent to the effective region and in which a plurality of optical black pixels including photoelectric conversion units that are shielded from light is arranged.

Here, the inventor of the present invention conceived of the idea of disposing an MIM element as a capacitance element between a light shielding layer and a wiring layer directly under the light shielding layer. This MIM element functions, for example, in a peripheral circuit, as a holding capacitance for holding signals output from the pixels or a clamp capacitance for generating differential signals between noise signals and optical signals output from the pixels.

In this case, in the peripheral region, the height of the light shielding layer from an upper surface of a semiconductor substrate is greater than in the case where the MIM element is not provided; therefore, also in the optical black region, the height of the light shielding layer from the upper surface of the semiconductor substrate is likely to be greater. This causes stray light from between the upper surface of the semiconductor substrate and the light shielding layer toward the optical black pixels to occur in the vicinity of a boundary between the effective region and the optical black region, and the optical black pixels thus cannot output reference signals of the correct black level.

SUMMARY OF THE INVENTION

The present invention provides for reducing stray light toward the optical black pixels in the optical black region even in a case where a capacitance element is provided between the light shielding layer in the peripheral region and the semiconductor substrate.

An image sensing device according to a first aspect of the present invention is an image sensing device having an image sensing region and a peripheral region arranged on the periphery of the image sensing region, the image sensing region including an effective region in which a plurality of effective pixels including photoelectric conversion units that are not shielded from light is arranged and an optical black region that is a region adjacent to the effective region and in which a plurality of optical black pixels including photoelectric conversion units that are shielded from light is arranged, the image sensing device including: a semiconductor substrate; a light shielding layer that is arranged above the semiconductor substrate and that shields the optical black region and the peripheral region from light; a first capacitance element that is arranged between the light shielding layer in the peripheral region and the semiconductor substrate and that is used to temporarily hold signals output from the effective pixels or the optical black pixels; and a second capacitance element that is arranged between the light shielding layer in the optical black region and the semiconductor substrate so as to shield the photoelectric conversion units of the optical black pixels from light.

An image sensing system according to a second aspect of the present invention includes the image sensing device according to the first aspect of the present invention, an optical system that forms an image on an image sensing surface of the image sensing device, and a signal processing unit that processes signals output from the image sensing device to generate image data.

According to the present invention, stray light toward the optical black pixels in the optical black region can be reduced even in the case where a capacitance element is provided between the light shielding layer in the peripheral region and the semiconductor substrate.

Further features of the present invention will become apparent from the following description of exemplary embodiments with reference to the attached drawings.

DESCRIPTION OF THE EMBODIMENTS

Figure 7:
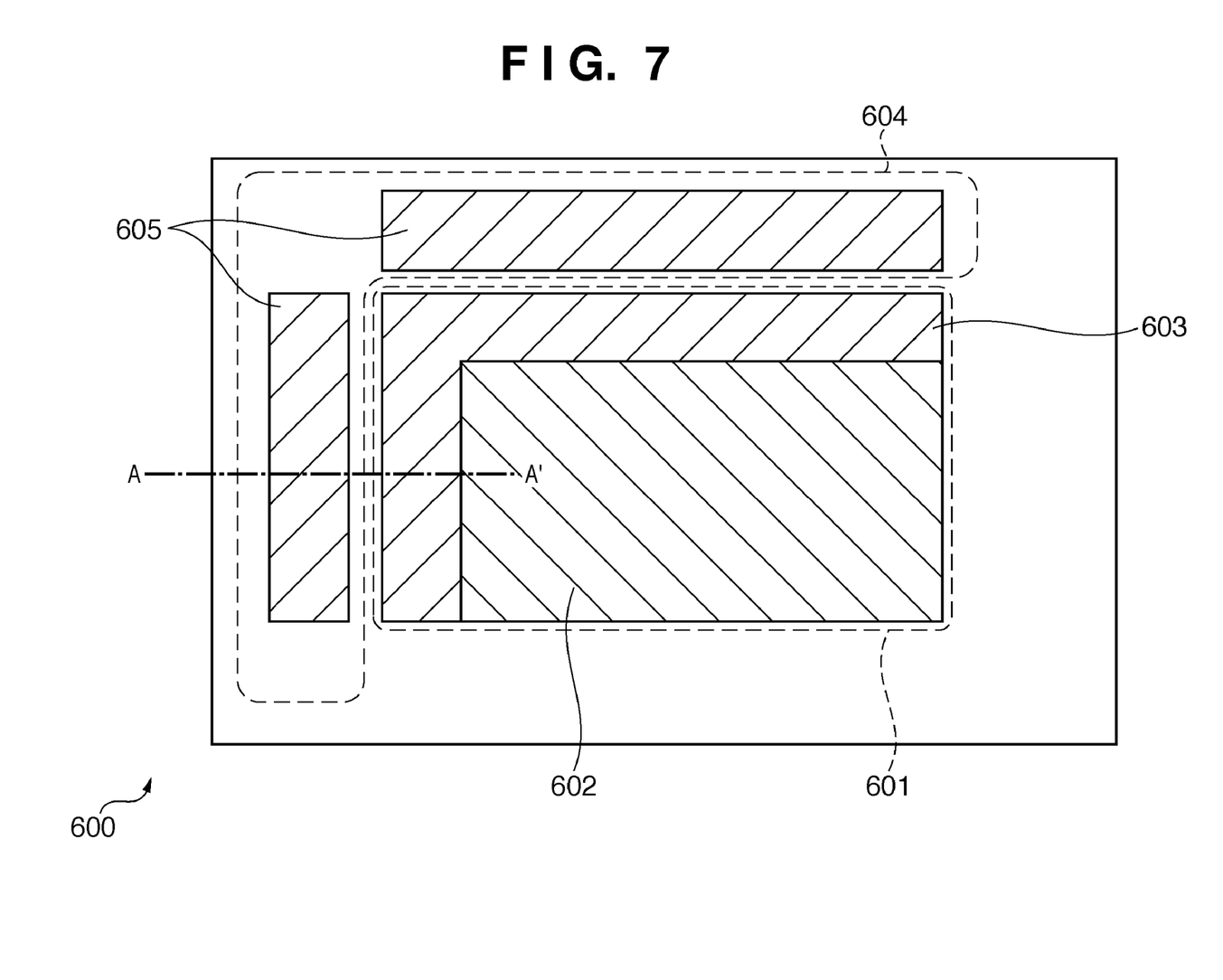
FIG. 7 is a plan view showing a layout configuration of an image sensing device 600.
Figure 8:
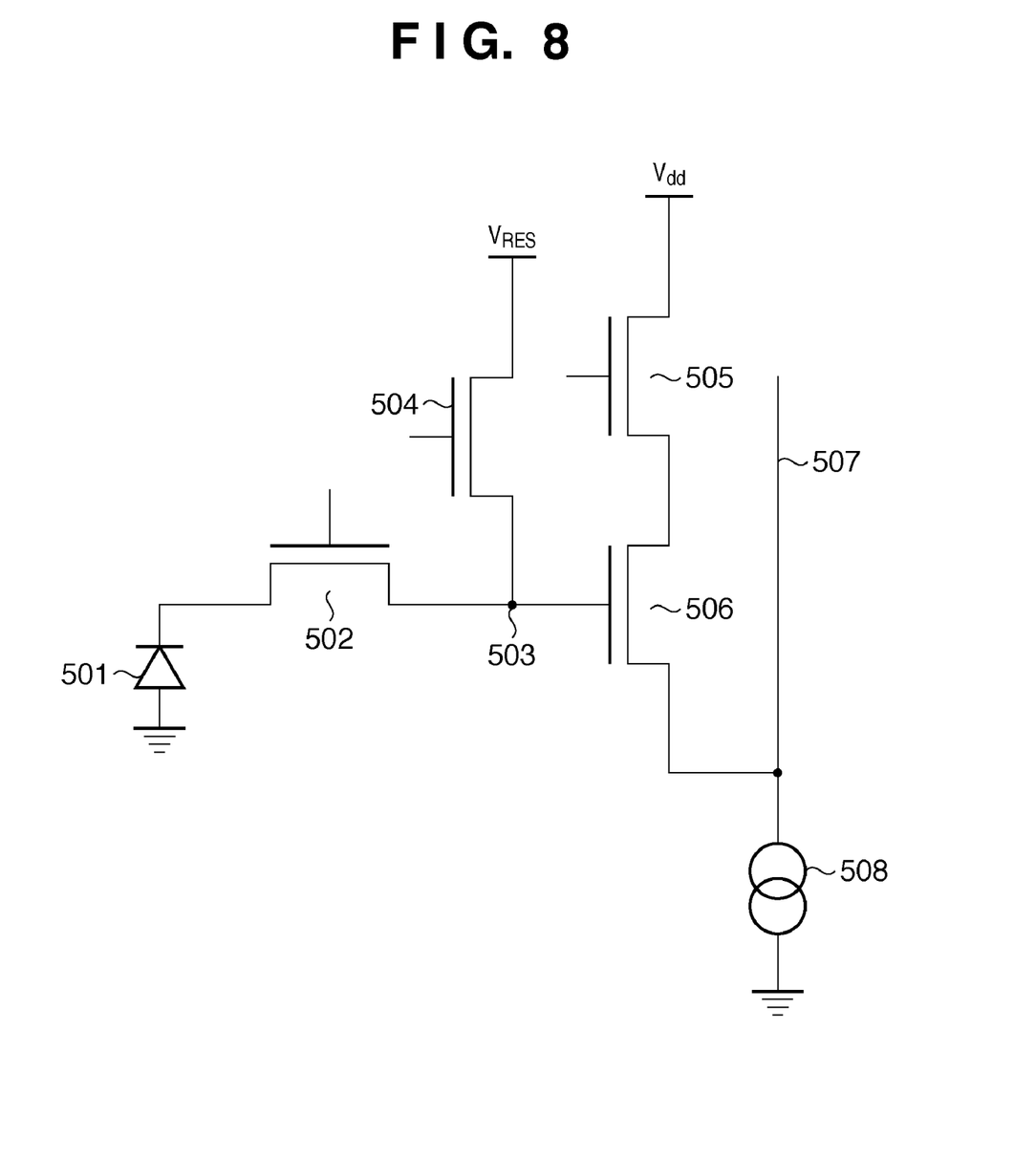
FIG. 8 is a diagram showing a circuit configuration of a pixel of the image sensing device 600.
Figure 9:
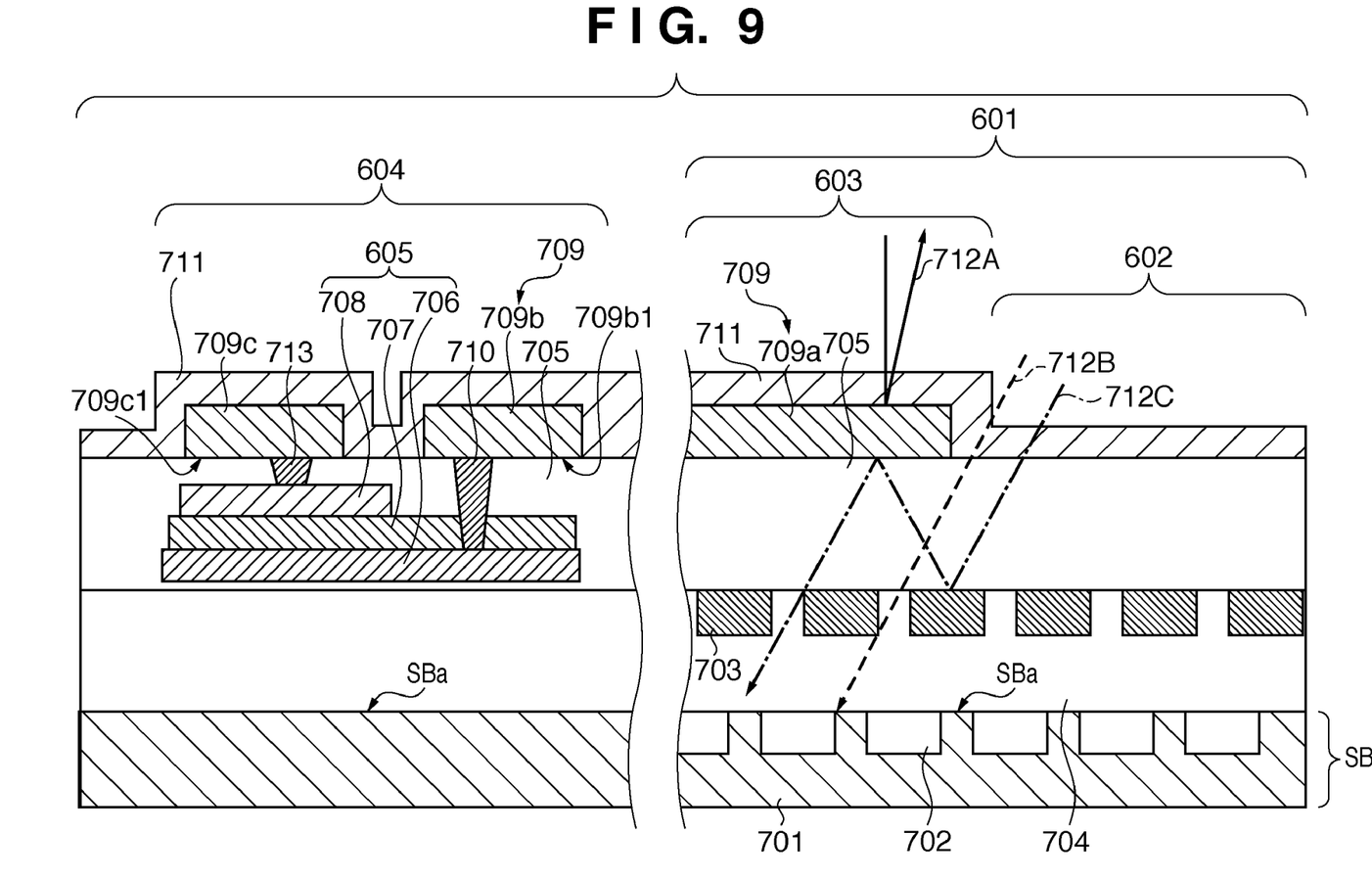
FIG. 9 is a diagram showing a cross-sectional configuration of the image sensing device 600.

The inventor of the present invention found that stray light toward optical black pixels occurs in an image sensing device 600 shown in FIGS. 7 to 9. This will be specifically described below.

As shown in FIG. 7, the image sensing device 600 has an image sensing region 601 and a peripheral region 604. FIG. 7 is a plan view showing a layout configuration of the image sensing device 600.

The image sensing region 601 includes an effective region 602 and an optical black region 603. A plurality of effective pixels including photoelectric conversion units that are not shielded from light is arranged in the effective region 602. The optical black region 603 is a region adjacent to the effective region 602. A plurality of optical black pixels including photoelectric conversion units that are shielded from light is arranged in the optical black region 603.

As shown in FIG. 8, each of the effective pixels and the optical black pixels includes a photoelectric conversion unit 501, a transfer unit 502, a charge-voltage conversion unit 503, a reset unit 504, an output unit 506, and a selection unit 505. FIG. 8 is a diagram showing a circuit configuration of a pixel of the image sensing device 600.

The photoelectric conversion unit 501 of an effective pixel is not shielded from light, and generates and accumulates electric charges (a signal) corresponding to light. The photoelectric conversion unit 501 of an optical black pixel is shielded from light and accumulates electric charges that is to be used as a reference signal of the black level.

The transfer unit 502 transfers the electric charges of the photoelectric conversion unit 501 (i.e., the electric charges generated by the photoelectric conversion unit 501 or the electric charges to be used as a reference signal of the black level) to the charge-voltage conversion unit 503. The transfer unit 502 is, for example, a transfer transistor and turns on when a transfer control signal φTX at an active level is supplied to a gate, thereby transferring the electric charges of the photoelectric conversion unit 501 to the charge-voltage conversion unit 503.

The charge-voltage conversion unit 503 converts the transferred electric charges into a voltage. The charge-voltage conversion unit 503 is, for example, a floating diffusion region.

The reset unit 504 resets the charge-voltage conversion unit 503. The reset unit 504 is, for example, a reset transistor and turns on when a reset control signal φRES at an active level is supplied to a gate, thereby resetting the charge-voltage conversion unit 503.

The output unit 506 outputs a signal corresponding to the voltage of the charge-voltage conversion unit 503 to a vertical output line 507. The output unit 506 is, for example, an amplification transistor and performs a source follower operation in conjunction with a constant current source 508 connected to the vertical output line 507, thereby outputting a signal corresponding to the voltage of the charge-voltage conversion unit 503 to the vertical output line 507. Specifically, in a state where the charge-voltage conversion unit 503 has been reset by the reset unit 504, the output unit 506 outputs a noise signal corresponding to the voltage of the charge-voltage conversion unit 503 to the vertical output line 507. In a state where the electric charges of the photoelectric conversion unit 501 have been transferred to the charge-voltage conversion unit 503 by the transfer unit 502, the output unit 506 outputs an optical signal corresponding to the voltage of the charge-voltage conversion unit 503 to the vertical output line 507.

The selection unit 505 sets the pixel (effective pixel or optical black pixel) to a selected/deselected state. The selection unit 505 is, for example, a selection transistor and turns on when a selection control signal φSEL at an active level is supplied to a gate, thereby setting the pixel to the selected state. The selection unit 505 turns off when a selection control signal φSEL at a non-active level is supplied to the gate, thereby setting the pixel to the deselected state.

A vertical scanning circuit 620 (see FIG. 6), a horizontal scanning circuit (not shown), and a holding circuit (not shown) are arranged in the peripheral region 604 shown in FIG. 7. Each of the vertical scanning circuit 620, the horizontal scanning circuit, and the holding circuit can be implemented by, for example, a transistor, a resistance element (not shown), a capacitance element, and the like.

The vertical scanning circuit 620 scans, in a vertical direction, a plurality of pixels (effective pixels or optical black pixels) arranged in the image sensing region 601 and controls the transfer control signal φTX, reset control signal φRES, and selection control signal φSEL for the selected row.

The holding circuit temporarily holds and outputs signals (noise signals, optical signals) that have been output from the pixels to the vertical output line 507. The holding circuit includes an MIM element (a first capacitance element) 605. As described later, the MIM element 605 is an element that has a metal-insulator-metal structure and functions as a capacitance. The MIM element 605 is used as a holding capacitance for temporarily holding signals (noise signals or optical signals) output from the effective pixels or the optical black pixels.

It should be noted that the MIM element 605 may also be used as a clamp capacitance, one terminal of which is connected to the vertical output line 507 and the other terminal of which is connected to a column amplifier.

FIG. 9 is a diagram showing a cross-sectional configuration of the image sensing device 600. FIG. 9 shows a cross-sectional configuration of the effective region 602, the optical black region 603, and the peripheral region 604 of the image sensing device 600.

The image sensing device 600 includes a semiconductor substrate SB, a light shielding layer 709, a wiring layer 703, an interlayer film 704, an interlayer film 705, the MIM element 605, a plug 710, a plug 713, and a passivation film 711.

The semiconductor substrate SB includes a well region 701 and a photoelectric conversion unit 702. In the effective region 602 and the optical black region 603, a plurality of photoelectric conversion units 702 is arranged in the vicinity of an upper surface of the semiconductor substrate SB. The well region 701 is arranged within the semiconductor substrate SB so as to surround each of the photoelectric conversion units 702. The semiconductor substrate SB is formed of, for example, silicon.

The light shielding layer 709 is arranged in the optical black region 603 and the peripheral region 604. The light shielding layer 709 shields at least the optical black region 603 from light. The light shielding layer 709 includes wiring patterns 709a to 709c. The wiring pattern 709a is a pattern for shielding the optical black region 603 from light. The wiring pattern 709b and the wiring pattern 709c are patterns for transmitting a predetermined signal.

The wiring layer 703 is arranged between the semiconductor substrate SB and the light shielding layer 709. The wiring layer 703 is used to transmit a signal (electric charges) accumulated in the photoelectric conversion unit 501 of an effective pixel or an optical black pixel to a subsequent stage. Moreover, the wiring layer 703 is used, for example, to transmit a voltage of the charge-voltage conversion unit 503 to the output unit 506.

The interlayer film 704 is arranged between the semiconductor substrate SB and the wiring layer 703 so as to insulate the semiconductor substrate SB and the wiring layer 703 from each other. The interlayer film 704 is formed of, for example, silicon oxide.

The interlayer film 705 is arranged between the wiring layer 703 and the light shielding layer 709 so as to insulate the wiring layer 703 and the light shielding layer 709 from each other. The interlayer film 705 is formed of, for example, silicon oxide.

The MIM element 605 is arranged between the light shielding layer 709 in the peripheral region 604 and the semiconductor substrate SB. The MIM element 605 includes an upper electrode (a second upper electrode) 708, a lower electrode (a second lower electrode) 706, and an insulation film (a second insulation film) 707.

The upper electrode 708 extends in a direction along lower surfaces 709b1 and 709c1 of the light shielding layer 709. The upper electrode 708 is formed of, for example, at least one of aluminum, an aluminum alloy, titanium, titanium nitride, tantalum, tantalum nitride, tungsten, tungsten silicide, and copper.

The lower electrode 706 extends in a direction along an upper surface SBa of the semiconductor substrate SB. The lower electrode 706 is formed of, for example, at least one of aluminum, an aluminum alloy, titanium, titanium nitride, tantalum, tantalum nitride, tungsten, tungsten silicide, and copper.

The insulation film 707 is arranged between the upper electrode 708 and the lower electrode 706. The insulation film 707 is formed of, for example, one of an oxide film, a nitride film, and an oxynitride film which is containing one of Si, Ta, Hf, and Al as a main ingredient.

That is to say, the MIM element 605 has a metal-insulator-metal structure. The capacitance value of this structure has a weak dependence on the voltage.

The plug 710 connects the wiring pattern 709b of the light shielding layer 709 and the lower electrode 706 of the MIM element 605 to each other. The plug 710 is formed of, for example, W (tungsten).

The plug 713 connects the wiring pattern 709c of the light shielding layer 709 and the upper electrode 708 of the MIM element 605 to each other. The plug 713 is formed of, for example, W (tungsten).

Thus, for example, a reference voltage (e.g., a ground voltage) can be supplied to the lower electrode 706 of the MIM element 605 via the wiring pattern 709b and the plug 710. Moreover, electric charges corresponding to a signal (e.g., a noise signal or an optical signal) can be accumulated in the upper electrode 708 of the MIM element 605 via the wiring pattern 709c and the plug 713 so that the upper electrode 708 temporarily holds the signal.

Alternatively, for example, a reference voltage (e.g., a ground voltage) can be supplied to the upper electrode 708 of the MIM element 605 via the wiring pattern 709c and the plug 713. Moreover, electric charges corresponding to a signal (e.g., a noise signal or an optical signal) can be accumulated in the lower electrode 706 of the MIM element 605 via the wiring pattern 709b and the plug 710 so that the lower electrode 706 temporarily holds the signal.

In order to avoid the influence of the process load during wiring formation and fluctuations due to parasitic capacitance from other wiring or device elements, the MIM element 605 is not formed between formations of the wiring layers and is formed after the formations of the wiring layers and before the formation of the light shielding layer 709. After the MIM element 605 is formed, the interlayer film 705, the plug 710, and the light shielding layer 709 are formed such that the MIM element 605 is connected to the light shielding layer 709 via the plug 710 through the subsequently formed interlayer film 705 and is therefore formed between the light shielding layer 709 and the wiring layer 703 directly under the light shielding layer 709.

The passivation film 711 is arranged so as to cover the light shielding layer 709.

Here, the film thickness of the interlayer film 705 under the light shielding layer 709 is inevitably set such that the interlayer film 705 includes at least the MIM element 605, and accordingly the interlayer film 705 is thicker than in a case where the MIM element 605 is absent. At this time, light 712A vertically incident on the image sensing region 601 in the vicinity of the boundary between the effective region 602 and the optical black region 603 is blocked by the light shielding layer 709. In contrast, light 712B obliquely incident on the image sensing region 601 in the vicinity of the boundary between the effective region 602 and the optical black region 603 enters the photoelectric conversion units 702 of the optical black pixels from between the semiconductor substrate SB and the light shielding layer 709, or light 712C obliquely incident on the image sensing region 601 in the vicinity of the boundary between the effective region 602 and the optical black region 603 enters the photoelectric conversion units of the optical black pixels after being reflected by the wiring layer 703 and the light shielding layer 709.

In the case where an MIM element is provided in the peripheral region 604 between the light shielding layer 709 and the wiring layer 703 directly under the light shielding layer 709, as described above, the height of the light shielding layer 709 from the upper surface SBa of the semiconductor substrate SB is greater than in the case where no MIM element is provided. For this reason, also in the optical black region 603, the height of the light shielding layer 709 from the upper surface SBa of the semiconductor substrate SB is likely to be greater. As a result, stray light from between the semiconductor substrate SB and the light shielding layer 709 toward the optical black pixels occurs in the vicinity of the boundary between the effective region 602 and the optical black region 603, and the optical black pixels thus cannot output reference signals of the correct black level.

Figure 1:
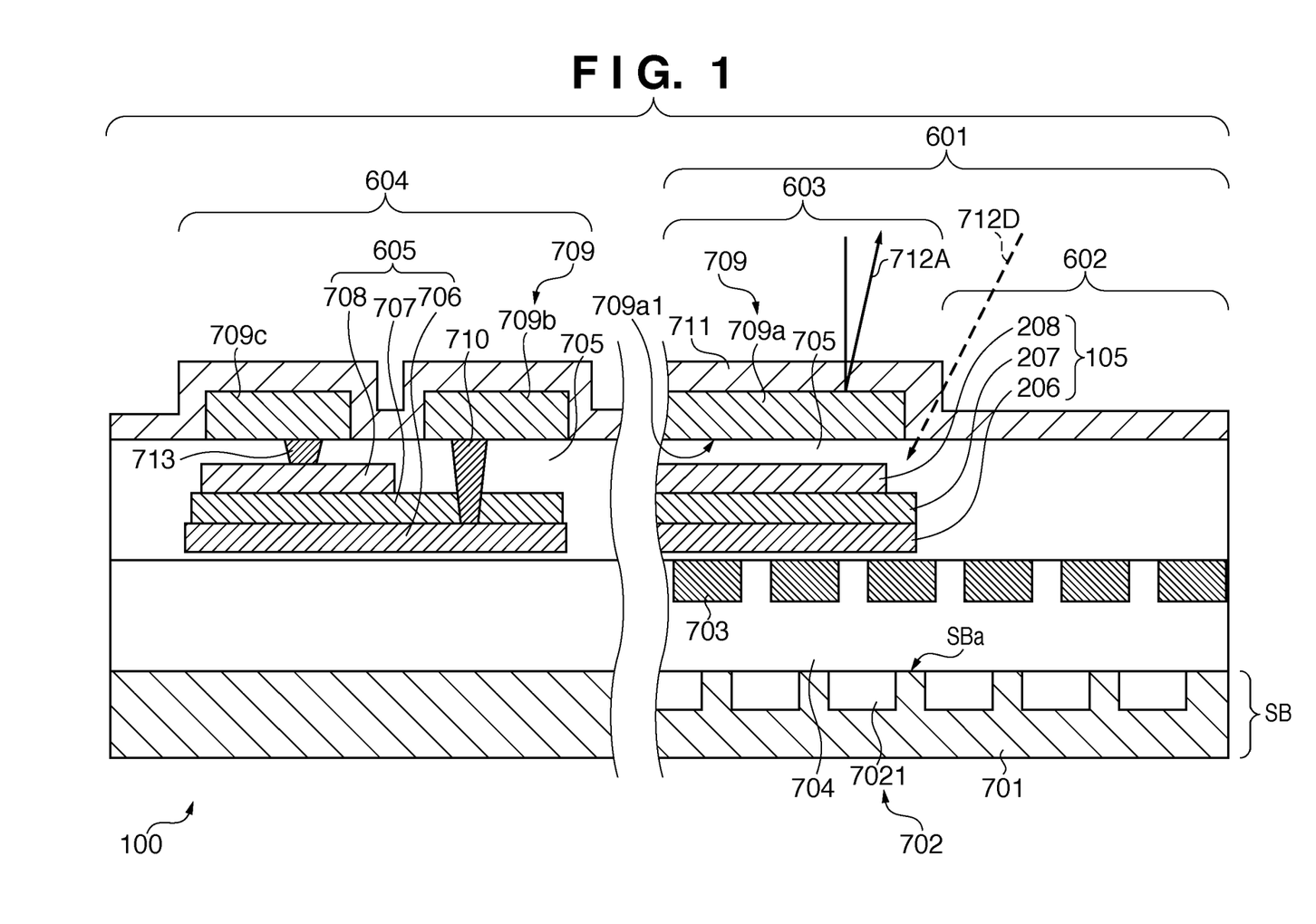
FIG. 1 is a diagram showing a cross-sectional configuration of an image sensing device 100 according to a first embodiment of the present invention.

Next, an image sensing device 100 according to a first embodiment of the present invention will be described using FIG. 1. FIG. 1 is a diagram showing a cross-sectional configuration of the image sensing device 100 according to the first embodiment of the present invention. In the following description, portions different from those of the image sensing device 600 shown in FIGS. 7 to 9 will be mainly discussed.

The image sensing device 100 includes an MIM element (a second capacitance element) 105.

The MIM element 105 is arranged between the light shielding layer 709 in the optical black region 603 and the semiconductor substrate SB so as to shield the photoelectric conversion units of the optical black pixels from light. The MIM element 105 is arranged above photoelectric conversion units 7021 of the optical black pixels arranged adjacent to the boundary between the effective region 602 and the optical black region 603.

The MIM element 105 includes an upper electrode 208, a lower electrode 206, and an insulation film 207.

The upper electrode 208 extends in a direction along a lower surface 709a1 of the light shielding layer 709. The upper electrode 208 is formed of a material similar to the material for the upper electrode 708 of the MIM element 605. The upper electrode 208 is formed of, for example, at least one of aluminum, an aluminum alloy, titanium, titanium nitride, tantalum, tantalum nitride, tungsten, tungsten silicide, and copper. The upper electrode 208 has a thickness similar to the thickness of the upper electrode 708 of the MIM element 605.

The lower electrode 206 extends in a direction along the upper surface SBa of the semiconductor substrate SB. The lower electrode 206 is formed of a material similar to the material for the lower electrode 706 of the MIM element 605. The lower electrode 206 is formed of, for example, at least one of aluminum, an aluminum alloy, titanium, titanium nitride, tantalum, tantalum nitride, tungsten, tungsten silicide, and copper. The lower electrode 206 has a thickness similar to the thickness of the lower electrode 706 of the MIM element 605.

The insulation film 207 is arranged between the upper electrode 208 and the lower electrode 206. The insulation film 207 is formed of, for example, one of an oxide film, a nitride film, and an oxynitride film which is containing one of Si, Ta, Hf, and Al as a main ingredient. The insulation film 207 has a thickness similar to the thickness of the insulation film 707 of the MIM element 605.

That is to say, the MIM element 105 has a metal-insulator-metal structure.

Thus, in the vicinity of the boundary between the effective region 602 and the optical black region 603, the MIM element 105 can block incident light that enters from between the semiconductor substrate SB and the light shielding layer 709 toward the optical black pixels. Consequently, stray light toward the optical black pixels can be reduced even in the case where the height of the light shielding layer 709 from the upper surface SBa of the semiconductor substrate SB increases in the peripheral region 604 due to providing of an MIM element between the light shielding layer 709 and the wiring layer 703 directly under the light shielding layer 709. In other words, stray light toward the optical black pixels in the optical black region can be reduced even in the case where a capacitance element (an MIM element) is provided between the light shielding layer 709 in the peripheral region 604 and the semiconductor substrate SB.

Moreover, the MIM element 105 arranged in the optical black region 603 has a structure and a thickness similar to those of the MIM element 605 arranged in the peripheral region 604. Specifically, the upper electrode 208 of the MIM element 105 and the upper electrode 708 of the MIM element 605 are at the same height from the upper surface SBa of the semiconductor substrate SB. The lower electrode 206 of the MIM element 105 and the lower electrode 706 of the MIM element 605 are at the same height from the upper surface SBa of the semiconductor substrate SB. The insulation film 207 of the MIM element 105 and the insulation film 707 of the MIM element 605 are at the same height from the upper surface SBa of the semiconductor substrate SB. Thus, the image sensing device 100 according to the first embodiment has a structure suitable for reducing unevenness when an upper face of the interlayer film 705 is planarized.

For example, the MIM element 105 arranged in the optical black region 603 and the MIM element 605 arranged in the peripheral region 604 are formed by a process flow as described below.

After the pattern of the wiring layer 703 is formed, an insulation film that is to be used as a portion of the interlayer film 705 between the MIM elements 105 and 605 and the wiring layer 703 is formed on the wiring layer 703, and the insulation film is planarized by CMP or the like, as necessary. After that, a metal layer that is to be used as the lower electrodes 706 and 206, an insulating layer that is to be used as the insulation films 707 and 207, and a metal layer that is to be used as the upper electrodes 708 and 208 are deposited in that order on the insulation film by a PVD method, a CVD method, or the like.

Then, patterning is performed using, for example, photolithography and dry etching, whereby each of the lower electrodes 706 and 206, the insulation films 707 and 207, and the upper electrodes 708 and 208 is formed. As a result, the MIM element 105 has a structure and a thickness similar to those of the MIM element 605.

After that, an insulation film is deposited so as to cover the MIM element 605 and the MIM element 105 and an upper face of the deposited insulation film is planarized by CMP or the like, and the interlayer film 705 is thus formed. The interlayer film 705 represents for a plurality of films. At this time, since the MIM element 105 has a structure and a thickness similar to those of the MIM element 605, the upper face of the insulation film can be planarized with little unevenness generated between the peripheral region 604 and the image sensing region 601.

Then, a metal layer that is to be used as the light shielding layer 709 is deposited on the planarized upper face of the interlayer film 705, and then the metal layer is patterned. The light shielding layer 709 is thus formed. Furthermore, the passivation film 711 is formed so as to cover the interlayer film 705 and the light shielding layer 709.

As described above, according to the first embodiment, light blockage can be realized at a height closer to the PDs (photodiodes) even when the interlayer film 705 for forming an MIM element therein is present, and in particular, a light component of oblique light 712D straying toward the optical black region can therefore be blocked. The optical black pixels can thus stably output the correct black level.

Furthermore, according to the first embodiment, the MIM elements are used as a light-shielding film for blocking light at a height closer to the PDs, and therefore it is not necessary to add new steps of forming the light-shielding film by a film deposition process, patterning, and the like. Moreover, in the case where the insulation film 207 of the MIM element is formed by a CVD method, uncombined hydrogen contained in the insulation film 207 diffuses due to heat treatment during the manufacturing process and is supplied to the optical black region 603 efficiently and uniformly. The dark current through the optical black region 603 can thus be reduced. The metal for forming the lower electrodes 706 and 206 can be simultaneously or separately patterned. The insulation film for forming the insulation films 707 and 207 can be also simultaneously or separately patterned. The metal for forming the upper electrodes 708 and 208 can be also simultaneously or separately patterned. The insulation films 707 and 207 can be films that are same with the interlayer film 705. However, it is preferable that the insulation films 707 and 207 are made of a material having a high dielectric constant in order to increase the capacitance of the MIM elements. In this case, the insulation films of the MIM elements are preferably formed as patterned films made of a material that is different from that of the interlayer film 705. This is because that forming the insulation films 707 and 207 from a material that is same with that of the interlayer film 705 means that a film having a high dielectric constant, namely, a film having a high refractive index is placed on the photoelectric conversion unit in the effective region.

It should be noted that although the light shielding layer 709 of the first embodiment is formed in the optical black region 603 as is the case with the conventional example, the light shielding layer 709 is not necessarily disposed in the optical black region as long as the light-shielding performance achieved by the MIM element meets the requirements.

Figure 2:
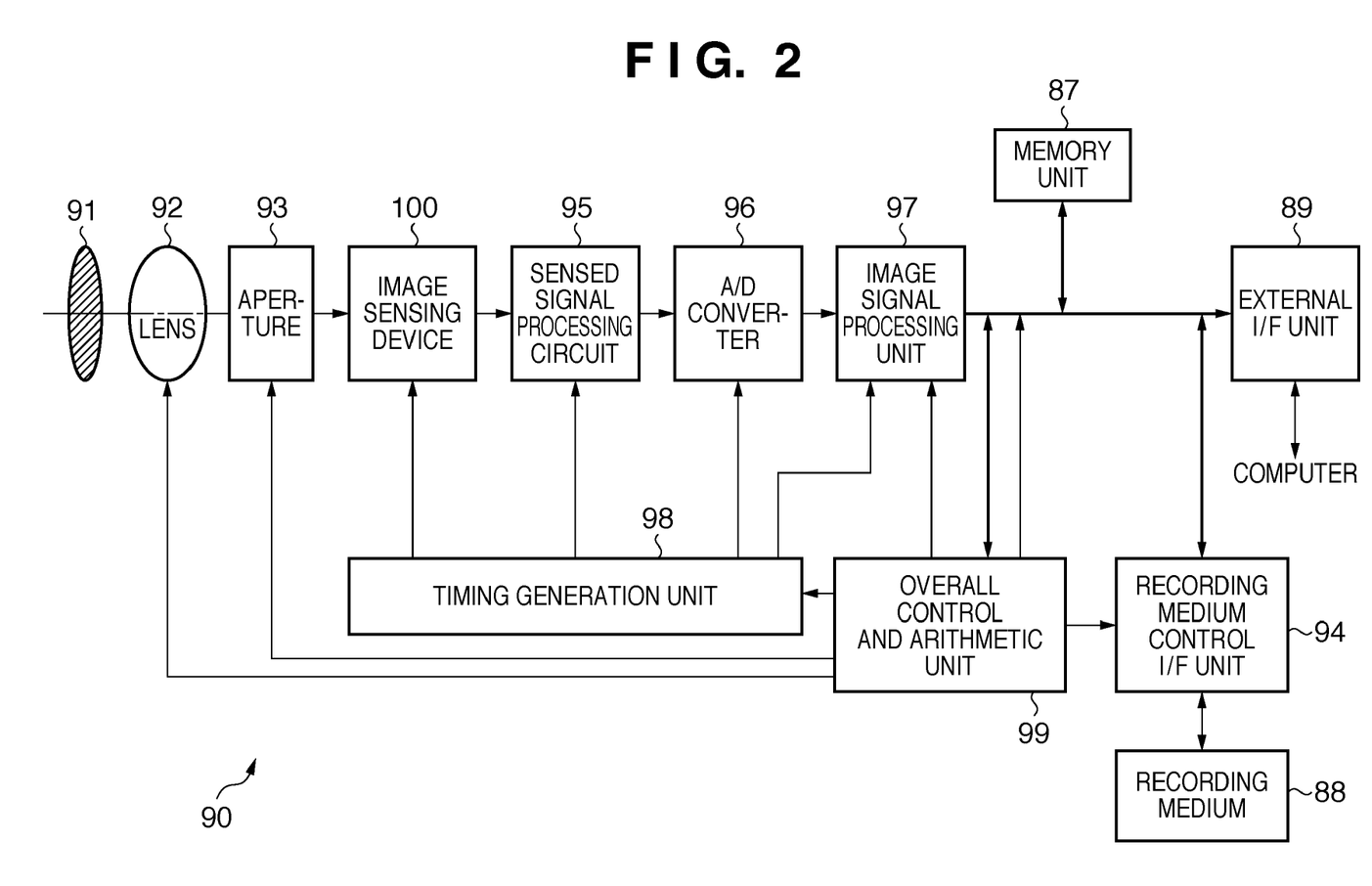
FIG. 2 is a diagram showing the configuration of an image sensing system to which the image sensing device according to the first embodiment has been applied.

Next, an example of an image sensing system to which the image sensing device of the present invention has been applied is shown in FIG. 2.

As shown in FIG. 2, an image sensing system 90 mainly includes an optical system, the image sensing device 100, and a signal processing unit. The optical system mainly includes a shutter 91, a lens 92, and an aperture 93. The signal processing unit mainly includes a sensed signal processing circuit 95, an A/D converter 96, an image signal processing unit 97, a memory unit 87, an external I/F unit 89, a timing generation unit 98, an overall control and arithmetic unit 99, a recording medium 88, and a recording medium control I/F unit 94. It should be noted that the signal processing unit does not necessarily include the recording medium 88.

The shutter 91 is provided on an optical path in front of the lens 92 and controls exposure.

The lens 92 refracts incident light to form an image of an object on an image sensing surface of the image sensing device 100.

The aperture 93 is provided on the optical path between the lens 92 and the image sensing device 100 and adjusts the amount of light that is guided to the image sensing device 100 after passing through the lens 92.

The image sensing device 100 converts the image of the object formed on the image sensing surface (a pixel array) into image signals. The image sensing device 100 reads out and outputs the image signals from the pixel array.

The sensed signal processing circuit 95 is connected to the image sensing device 100 and processes the image signals output from the image sensing device 100.

The A/D converter 96 is connected to the sensed signal processing circuit 95 and converts the processed image signals (analog signals) output from the sensed signal processing circuit 95 into image signals (digital signals).

The image signal processing unit 97 is connected to the A/D converter 96, and performs arithmetic processing such as various types of correction on the image signals (digital signals) output from the A/D converter 96 to generate image data. This image data is supplied to the memory unit 87, the external I/F unit 89, the overall control and arithmetic unit 99, the recording medium control I/F unit 94, and the like.

The memory unit 87 is connected to the image signal processing unit 97 and stores the image data output from the image signal processing unit 97.

The external I/F unit 89 is connected to the image signal processing unit 97. The image data output from the image signal processing unit 97 is thus transferred to an external apparatus (e.g., a personal computer) via the external I/F unit 89.

The timing generation unit 98 is connected to the image sensing device 100, the sensed signal processing circuit 95, the A/D converter 96, and the image signal processing unit 97. Timing signals are thus supplied to the image sensing device 100, the sensed signal processing circuit 95, the A/D converter 96, and the image signal processing unit 97. Then, the image sensing device 100, the sensed signal processing circuit 95, the A/D converter 96, and the image signal processing unit 97 operate in synchronization with the timing signals.

The overall control and arithmetic unit 99 is connected to the timing generation unit 98, the image signal processing unit 97, and the recording medium control I/F unit 94 and performs overall control of the timing generation unit 98, the image signal processing unit 97, and the recording medium control I/F unit 94.

The recording medium 88 is detachably connected to the recording medium control I/F unit 94. The image data output from the image signal processing unit 97 is thus recorded on the recording medium 88 via the recording medium control I/F unit 94.

With the foregoing configuration, a image (image data) with high quality can be obtained if image signals with high quality can be obtained in the image sensing device 100.

Figure 3:
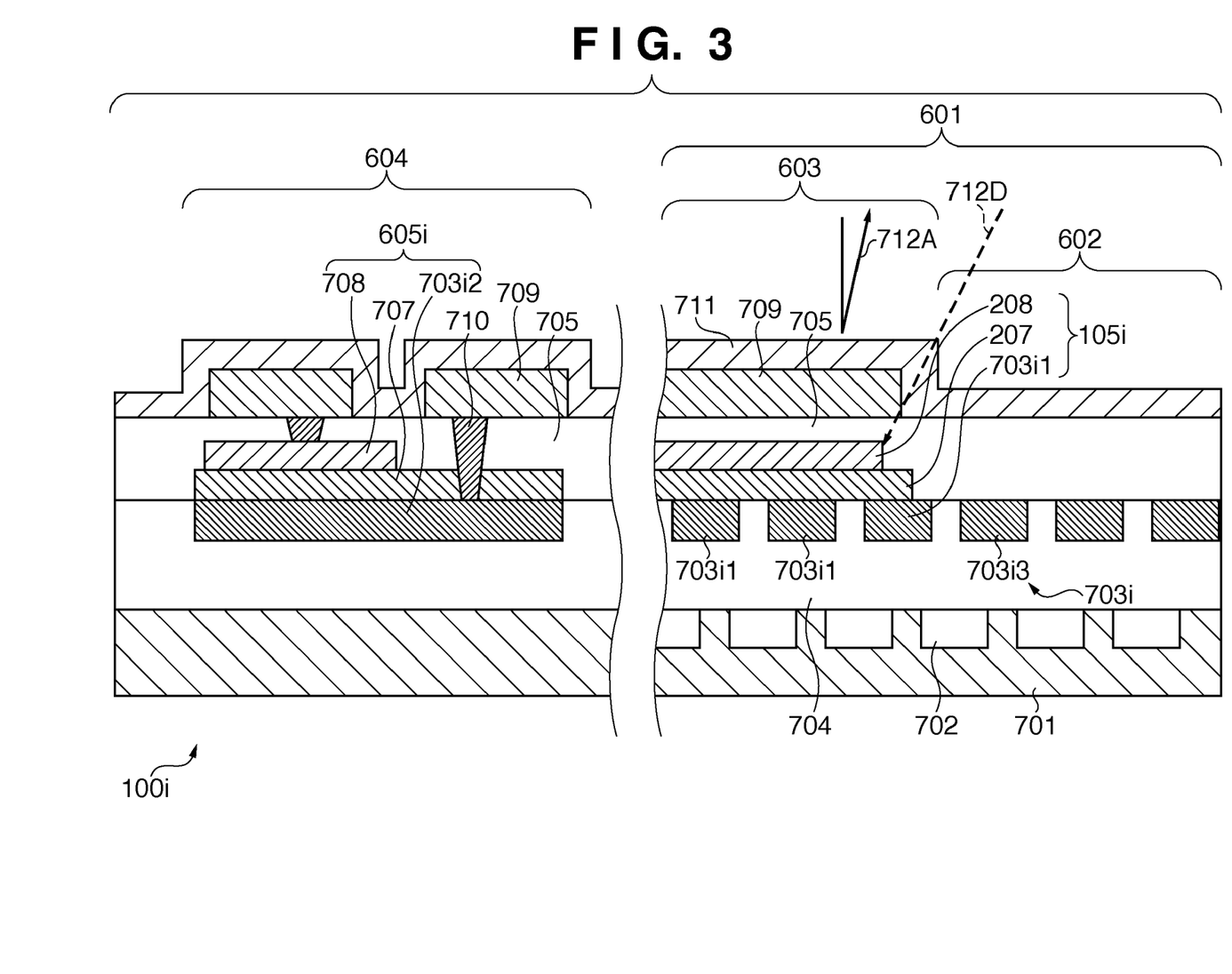
FIG. 3 is a diagram showing a cross-sectional configuration of an image sensing device 100i according to a second embodiment of the present invention.

Next, an image sensing device 100*i* according to a second embodiment of the present invention will be described using FIG. 3. FIG. 3 is a diagram showing a cross-sectional configuration of the image sensing device 100*i* according to the second embodiment of the present invention. In the following description, portions different from those of the first embodiment will be mainly discussed.

The image sensing device 100*i* includes a wiring layer 703*i*, an MIM element 605*i*, and an MIM element 105*i*.

The wiring layer 703*i* includes a wiring pattern (a first wiring pattern) 703*i*1, a wiring pattern 703*i*2, and a wiring pattern 703*i*3. The wiring pattern 703*i*1 is a pattern for transmitting a predetermined signal and is also used as the lower electrode of the MIM element 105*i*. The wiring pattern 703*i*2 is a pattern for transmitting a signal or predetermined reference voltage and is also used as the lower electrode of the MIM element 605*i*.

In this manner, the wiring patterns of the wiring layer 703*i* arranged between the light shielding layer 709 and the semiconductor substrate SB are used as the lower electrodes of the MIM elements 605*i* and 105*i*. The height of the upper electrodes of the MIM elements 605*i* and 105*i* from the upper surface SBa of the semiconductor substrate SB can thus be reduced. As a result, the MIM element 105*i* can block light at a height still closer to the photoelectric conversion units of the optical black pixels.

Figure 4:
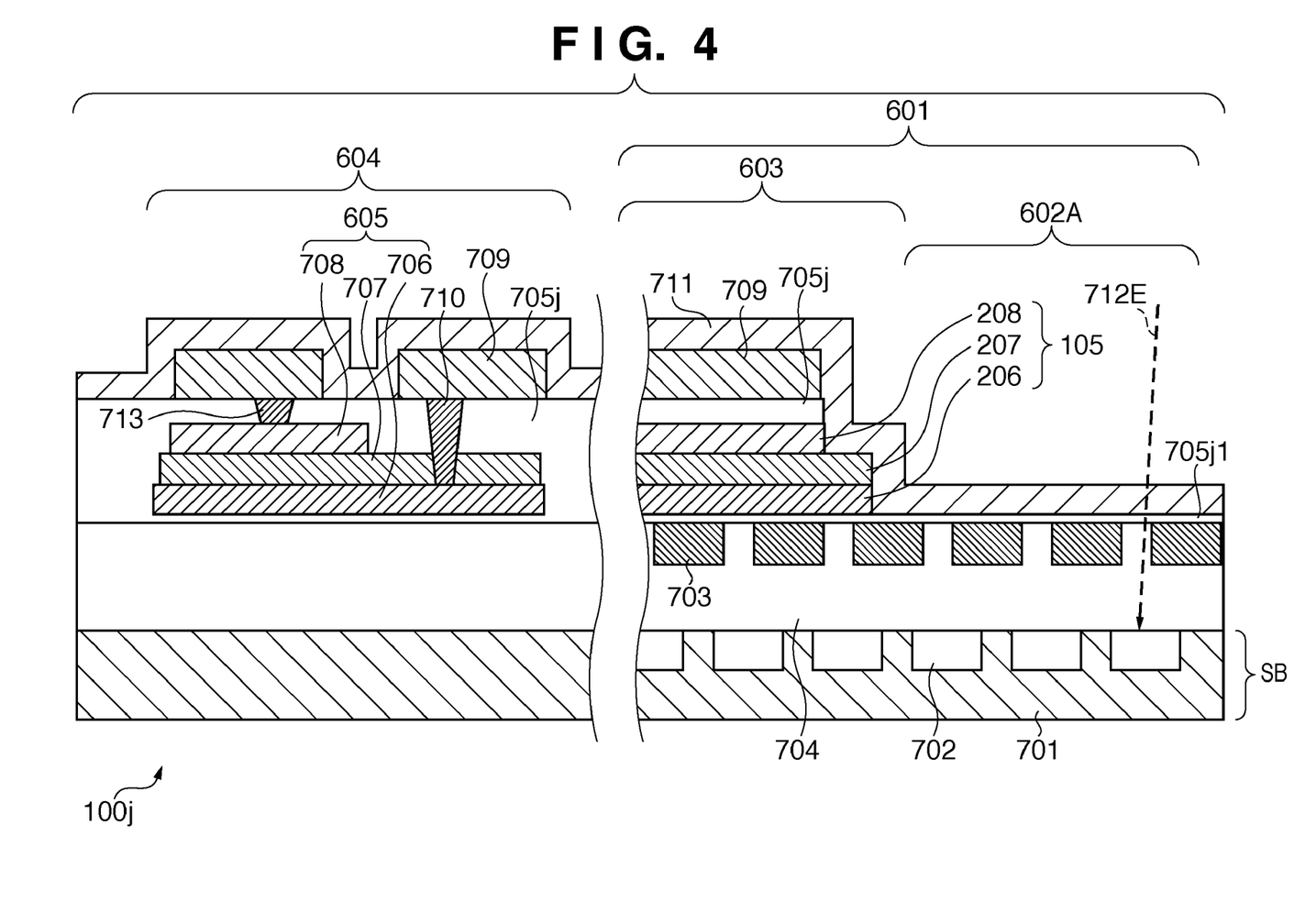
FIG. 4 is a diagram showing a cross-sectional configuration of an image sensing device 100j according to a third embodiment of the present invention.

Next, an image sensing device 100*j* according to a third embodiment of the present invention will be described using FIG. 4. FIG. 4 is a diagram showing a cross-sectional configuration of the image sensing device 100*j* according to the third embodiment of the present invention. In the following description, portions different from those of the first embodiment will be mainly discussed.

The image sensing device 100*j* includes an interlayer film 705*j*. The interlayer film 705*j* is partially removed in the effective region 602A and has a portion 705*j*1 with a reduced height. Thus, light can be effectively collected on the effective pixels.

This interlayer film 705*j* is formed by a process as described below.

The process is similar to that of the first embodiment up to the step of forming the light shielding layer 709 on the planarized upper face of the insulation film that is to be used as the interlayer film 705*j*.

After the step, a resist pattern is formed so as to cover the insulation film and the light shielding layer 709 in the peripheral region 604 and the optical black region 603. A portion of the insulation film in an effective region 602A that is to be used as the interlayer film 705*j* is removed by performing anisotropic dry etching using the resist pattern as a mask, under conditions (e.g., the etching time) such that the wiring layer 703 immediately under the insulation film is not exposed. The portion 705*j*1 with a reduced height in the effective region 602A is thus formed.

Then, after the resist pattern is detached using a chemical solution and removed, the passivation film 711 is formed so as to cover the interlayer film 705*j* and the light shielding layer 709.

Here, in FIG. 4, the MIM element 105 arranged in the optical black region 603 and the light shielding layer 709 are in a stepped arrangement from the effective region 602A to the optical black region 603. Specifically, end faces of the upper electrode 208 of the MIM element 105, the interlayer film 705*j*, and the light shielding layer 709 are provided farther away from the effective region 602A than end faces of the lower electrode 206 and the insulation film 207 of the MIM element 105. With such a configuration, unevenness between the effective region 602A and the optical black region 603 is more gradual, and this enables easy planarization even when the film thickness of the passivation film 711 or a planarized layer that may be subsequently formed is thin.

Figure 5:
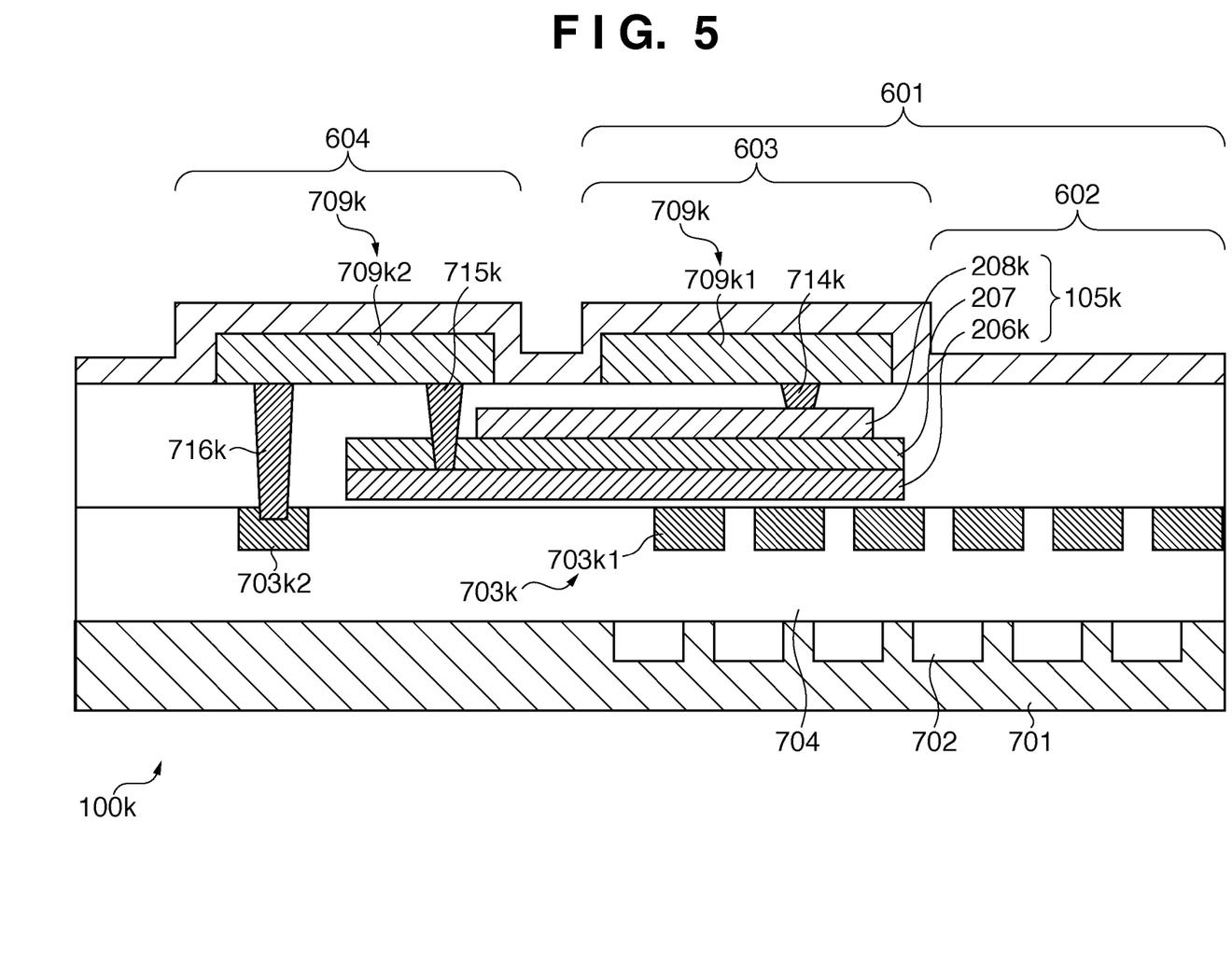
FIG. 5 is a diagram showing a cross-sectional configuration of an image sensing device 100k according to a fourth embodiment of the present invention.
Figure 6:
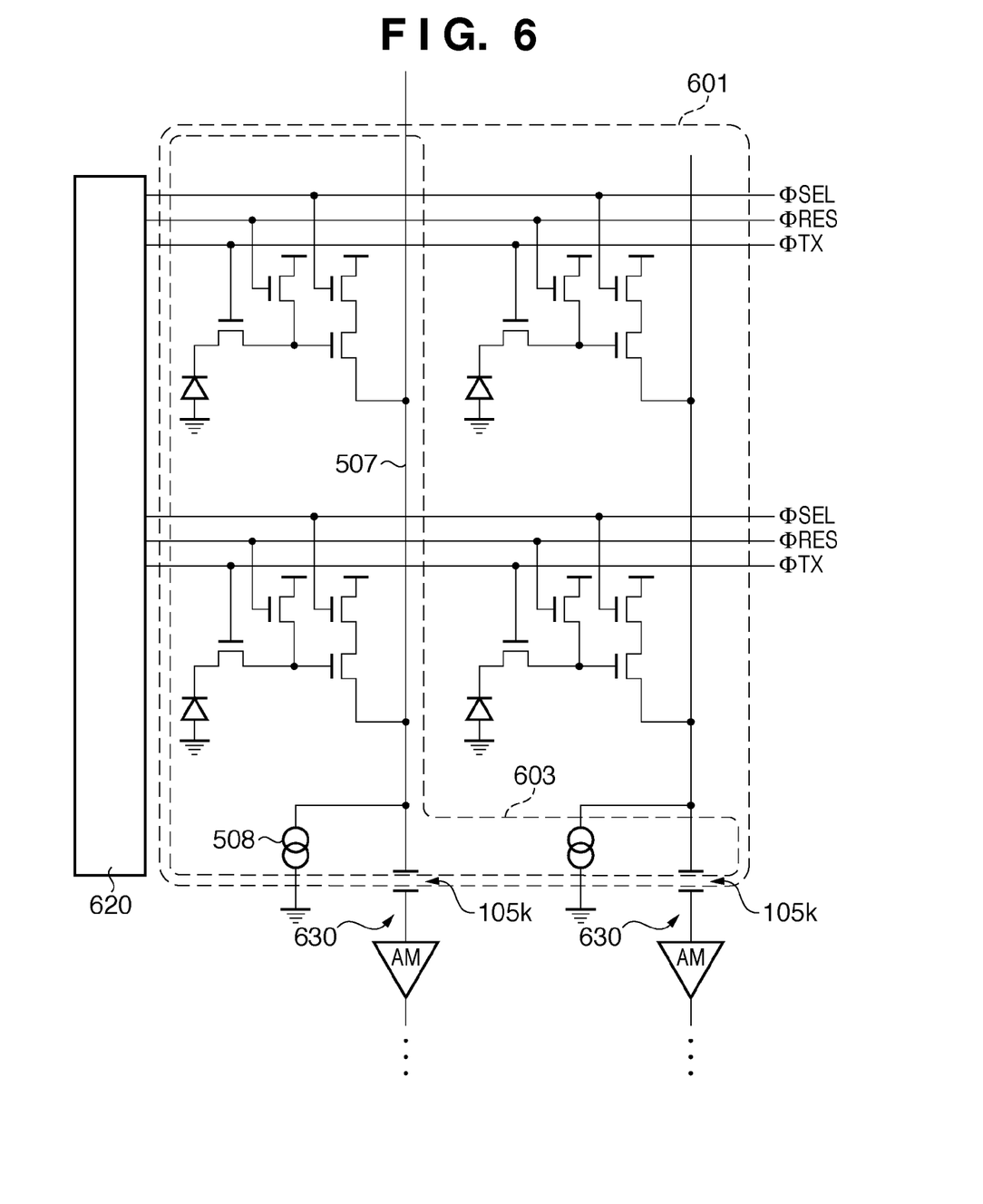
FIG. 6 is a diagram showing a circuit configuration of the image sensing device 100k according to the fourth embodiment of the present invention.

Next, an image sensing device 100*k* according to a fourth embodiment of the present invention will be described using FIGS. 5 and 6. FIG. 5 is a diagram showing a cross-sectional configuration of the image sensing device 100*k* according to the fourth embodiment of the present invention. FIG. 6 is a diagram showing a circuit configuration of the image sensing device 100*k* according to the fourth embodiment of the present invention.

As shown in FIG. 5, the image sensing device 100*k* includes a light shielding layer 709*k*, a wiring layer 703*k*, an MIM element 105*k*, a plug 714*k*, a plug 715*k*, and a plug 716*k*.

The light shielding layer 709*k* includes a wiring pattern (a second wiring pattern) 709*k*1 and a wiring pattern 709*k*2. The wiring pattern 709*k*1 is a pattern for shielding the optical black region 603 from light and is also used as the vertical output line 507 (see FIG. 6). The wiring pattern 709*k*2 is used as a part of a line 630 that connects the MIM element 105*k* and a column amplifier AM (see FIG. 6) to each other.

The wiring layer 703*k* includes a wiring pattern 703*k*1 and a wiring pattern 703*k*2. The wiring pattern 703*k*1 transmits a predetermined signal. The wiring pattern 703*k*2 is used as the part of the line 630 that connects the MIM element 105*k* and the column amplifier AM (see FIG. 6) to each other. The wiring pattern 703*k*2 is connected to the wiring pattern 709*k*2 via the plug 716*k*.

The MIM element 105*k* extends from the optical black region 603 to a portion of the peripheral region 604 (see FIG. 7) that is adjacent to the optical black region 603. The MIM element 105*k* is used as a clamp capacitance connected to the vertical output line 507 (see FIG. 6). In other words, the MIM element 105*k* receives noise signals and optical signals from the pixels (optical black pixels or effective pixels) at different timings via the vertical output line 507 and performs a clamping operation in conjunction with the column amplifiers, thereby generating differential signals between the noise signals and the optical signals.

The MIM element 105*k* includes an upper electrode 208*k* and a lower electrode 206*k*. The upper electrode 208*k* is connected to the wiring pattern 709*k*1 via the plug 714*k*. The lower electrode 206*k* is connected to the wiring pattern 709*k*2 via the plug 715*k*.

The plug 714*k* connects the wiring pattern 709*k*1 of the light shielding layer 709*k* and the upper electrode 208*k* of the MIM element 105*k* to each other. The plug 714*k* is formed of, for example, W (tungsten).

The plug 715*k* connects the wiring pattern 709*k*2 of the light shielding layer 709*k* and the lower electrode 206*k* of the MIM element 105*k* to each other. The plug 715*k* is formed of, for example, W (tungsten).

The plug 716*k* connects the wiring pattern 709*k*2 of the light shielding layer 709*k* and the wiring pattern 703*k*2 of the wiring layer 703*k* to each other. The plug 716*k* is formed of, for example, W (tungsten).

According to the fourth embodiment, since the MIM element serving as a clamp capacitance extends from the optical black region to a region of the peripheral region that is adjacent to the optical black region, an increase in the chip area in the case where a clamp capacitance is formed can be suppressed. Moreover, since a clamp capacitance having a large capacitance value is used, the mixing of high-frequency noise having a small amplitude that is caused by fluctuations of the power supply or the GND potential during transmission of signals output from the pixels to the column amplifiers into the signals can be suppressed. The embodiments mentioned above can be combined with each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-308999, filed Dec. 3, 2008 which is hereby incorporated by reference herein in its entirety.

What is claimed is:

1. An image sensing device having an image sensing region and a peripheral region arranged on the periphery of the image sensing region, the image sensing region including an effective region in which a plurality of effective pixels including photoelectric conversion units that are not shielded from light is arranged and an optical black region that is a region adjacent to the effective region and in which a plurality of optical black pixels including photoelectric conversion units that are shielded from light is arranged;

the image sensing device comprising:

a semiconductor substrate;

a light shielding layer that is arranged above the semiconductor substrate and that shields the optical black region and the peripheral region from light;

a first capacitance element that is arranged between the light shielding layer in the peripheral region and the semiconductor substrate and that is used to temporarily hold signals output from the effective pixels or the optical black pixels; and a second capacitance element that is arranged between the light shielding layer in the optical black region and the semiconductor substrate so as to shield the photoelectric conversion units of the optical black pixels from light.

2. The image sensing device according to claim 1, wherein the second capacitance element is arranged above the photoelectric conversion units of the optical black pixels that are arranged adjacent to a boundary between the effective region and the optical black region.

3. The image sensing device according to claim 2, wherein the second capacitance element comprises:

an upper electrode that extends in a direction along a lower surface of the light shielding layer;

a lower electrode that extends in a direction along an upper surface of the semiconductor substrate; and an insulation film that is arranged between the upper electrode and the lower electrode.

4. The image sensing device according to claim 3, wherein the first capacitance element comprises:

a second upper electrode that is at a same height from a upper surface of the semiconductor substrate as the upper electrode;

a second lower electrode that is at a same height from the upper surface of the semiconductor substrate as the lower electrode; and a second insulation film that is at a same height from the upper surface of the semiconductor substrate as the insulation film.

5. The image sensing device according to claim 3, further comprising a wiring layer that is arranged between the light shielding layer in the optical black region and the semiconductor substrate and that transmits signals accumulated in the optical black pixels, wherein the wiring layer is also used as the lower electrode of the second capacitance element.

6. The image sensing device according to claim 3, wherein the insulation film is formed of one of an oxide film, a nitride film, and an oxynitride film; and the upper electrode and the lower electrode are formed of at least one of aluminum, an aluminum alloy, titanium, titanium nitride, tantalum, tantalum nitride, tungsten, tungsten silicide, and copper.

7. The image sensing device according to claim 1, wherein each of the first capacitance element and the second capacitance element has an MIM structure.

8. An image sensing system comprising:

the image sensing device according to claim 1;

an optical system that forms an image on an image sensing surface of the image sensing device; and a signal processing unit that processes signals output from the image sensing device to generate image data.

* * * * *